US012724099B2

(12) United States Patent
C et al.

(10) Patent No.: US 12,724,099 B2
(45) Date of Patent: Sep. 1, 2026

(54) SYSTEM AND METHOD FOR ENHANCING PROPELLER IMAGE QUALITY BY DENOISING BLADES

(71) Applicant: GE Precision Healthcare LLC, Waukesha, WI (US)

(72) Inventors: Florintina C, Bangalore (IN); Suresh Emmanuel Devadoss Joel, Bangalore (IN); Sajith Rajamani, Bangalore (IN); Preetham Shankpal, Bangalore (IN); Megha Goel, Bangalore (IN); Sudhanya Chatterjee, Bangalore (IN)

(73) Assignee: GE PRECISION HEALTHCARE LLC, Waukesha, WI (US)

( * ) Notice: Subject to any disclaimer, the term of this patent is extended or adjusted under 35 U.S.C. 154(b) by 450 days.

(21) Appl. No.: 18/446,898

(22) Filed: Aug. 9, 2023

(65) Prior Publication Data

US 2025/0052843 A1 Feb. 13, 2025

(51) Int. Cl.
*G01R 33/565* (2006.01)
*G01R 33/48* (2006.01)
(Continued)

(52) U.S. Cl.
CPC ..... *G01R 33/56509* (2013.01); *G01R 33/482* (2013.01); *G01R 33/5608* (2013.01);
(Continued)

(58) Field of Classification Search
None
See application file for complete search history.

(56) References Cited

U.S. PATENT DOCUMENTS

2019/0325621 A1* 10/2019 Wang ..................... A61B 6/037
2020/0033431 A1* 1/2020 Schlemper ............. G06F 17/18
(Continued)

FOREIGN PATENT DOCUMENTS

EP 4474847 A1 * 12/2024 ....... G01R 33/56545

OTHER PUBLICATIONS

Kaniewska et al., Application of deep learning-based image reconstruction in MR imaging of the shoulder joint to improve image quality and reduce scan time, Sep. 27, 2022, European Radiology, 14 pgs.

(Continued)

*Primary Examiner* — Miya J Cato
(74) *Attorney, Agent, or Firm* — Fletcher Yoder, P.C.

(57) ABSTRACT

A system and method for improving image quality of periodically rotated overlapping parallel lines with enhanced reconstruction (PROPELLER) imaging include acquiring a plurality of blades of k-space data of a region of interest in a rotational manner around a center of k-space via a magnetic resonance imaging (MRI) scanner from a coil during a PROPELLER sequence, wherein each blade of the plurality of blades of k-space data includes a plurality of parallel phase encoding lines sampled in a phase encoding order. The system and method also include utilizing a deep learning-based denoising network to denoise each blade of the plurality of blades of k-space data to generate a plurality of denoised blades. The system and method further include utilizing a PROPELLER reconstruction algorithm to generate a complex image from the plurality of denoised blades.

20 Claims, 13 Drawing Sheets

(51) Int. Cl.
*G01R 33/56* (2006.01)
*G06T 5/70* (2024.01)

(52) U.S. Cl.
CPC ...... *G06T 5/70* (2024.01); *G06T 2207/10088* (2013.01); *G06T 2207/20081* (2013.01); *G06T 2207/20084* (2013.01); *G06T 2207/30004* (2013.01)

(56) References Cited

U.S. PATENT DOCUMENTS

| | | | | |
|---|---|---|---|---|
| 2020/0278410 | A1* | 9/2020 | Millard | G01R 33/5608 |
| 2021/0272240 | A1* | 9/2021 | Litwiller | A61B 6/5258 |
| 2022/0026516 | A1* | 1/2022 | Guidon | G01R 33/565 |
| 2025/0061618 | A1* | 2/2025 | Moeller | G01R 33/5608 |
| 2025/0157098 | A1* | 5/2025 | C | G01R 33/5611 |
| 2025/0278819 | A1* | 9/2025 | Chaarlas | G06T 11/006 |

OTHER PUBLICATIONS

Lin et al., “Pseudo-Inverse Constrained (PICO) Reconstruction Reduces Colored Noise of Propeller and Improves the Gray-White Matter Differentiation,” Proceedings of the International Society for Magnetic Resonance in Medicine, 2017, 3 pgs.
Pipe, “Motion CorrectionWith Propeller MRI: Application to Head Motion and Free-Breathing Cardiac Imaging,” Magnetic Resonance in Medicine, 1999, 7 pgs.

* cited by examiner

SYSTEM AND METHOD FOR ENHANCING PROPELLER IMAGE QUALITY BY DENOISING BLADES

BACKGROUND

The subject matter disclosed herein relates to medical imaging and, more particularly, to a system and a method for enhancing propeller image quality by denoising blades.

Non-invasive imaging technologies allow images of the internal structures or features of a patient/object to be obtained without performing an invasive procedure on the patient/object. In particular, such non-invasive imaging technologies rely on various physical principles (such as the differential transmission of X-rays through a target volume, the reflection of acoustic waves within the volume, the paramagnetic properties of different tissues and materials within the volume, the breakdown of targeted radionuclides within the body, and so forth) to acquire data and to construct images or otherwise represent the observed internal features of the patient/object.

During magnetic resonance imaging (MRI), when a substance such as human tissue is subjected to a uniform magnetic field (polarizing field $B_0$), the individual magnetic moments of the spins in the tissue attempt to align with this polarizing field, but process about it in random order at their characteristic Larmor frequency. If the substance, or tissue, is subjected to a magnetic field (excitation field $B_1$) which is in the x-y plane and which is near the Larmor frequency, the net aligned moment, or "longitudinal magnetization", $M_z$, may be rotated, or "tipped", into the x-y plane to produce a net transverse magnetic moment, $M_t$. A signal is emitted by the excited spins after the excitation signal $B_1$ is terminated and this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradient fields vary according to the particular localization method being used. The resulting set of received nuclear magnetic resonance (NMR) signals are digitized and processed to reconstruct the image using one of many well-known reconstruction techniques.

Periodically rotated overlapping parallel lines with enhanced reconstruction (PROPELLER) is an MR technique which provides high resolution magnetic resonance imaging with reduced motion artifacts by providing the capability to remove motion affected blades and by oversampling the low spatial frequencies. While the noise is Gaussian in each blade, after gridding the blades into a Cartesian matrix, the noise becomes colored. Attempts at denoising colored noise are reported to produce blurriness and degraded image quality. The denoising performance becomes drastically worse in the case of low signal-to-noise ratio data.

BRIEF DESCRIPTION

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

In one embodiment, computer-implemented method for improving image quality of periodically rotated overlapping parallel lines with enhanced reconstruction (PROPELLER) imaging is provided. The computer-implemented method includes acquiring, via a processor, a plurality of blades of k-space data of a region of interest in a rotational manner around a center of k-space via a magnetic resonance imaging (MRI) scanner from a coil during a PROPELLER sequence, wherein each blade of the plurality of blades of k-space data includes a plurality of parallel phase encoding lines sampled in a phase encoding order. The computer-implemented method also includes utilizing, via the processor, a deep learning-based denoising network to denoise each blade of the plurality of blades of k-space data to generate a plurality of denoised blades. The computer-implemented method further includes utilizing, via the processor, a PROPELLER reconstruction algorithm to generate a complex image from the plurality of denoised blades.

In one embodiment, the plurality of blades of k-space data is acquired from a single channel of the coil.

In one embodiment, the plurality of blades of k-space data is acquired from a plurality of channels of the coil.

In one embodiment, the computer-implemented method further includes combining, via the processor, the plurality of blades of k-space data acquired from the plurality of channels prior to utilizing the deep learning-based denoising network to denoise each blade of the plurality of blades of k-space data.

In one embodiment, the computer-implemented method further includes utilizing, via the processor, a deep learning-based de-streaking network on the complex image to remove streaks.

In one embodiment, the computer-implemented method further includes training, via the processor, the deep learning-based denoising network on input-output data pairs utilizing supervised learning. The input-output data pairs include near perfect and conventional MR images simulated from natural images. The deep-learning-based denoising network is trained to predict noise in Cartesian acquired images.

In one embodiment, at least some pairs of simulated images include skewed aspect ratios.

In another embodiment, a system for improving image quality of periodically rotated overlapping parallel lines with enhanced reconstruction (PROPELLER) imaging is provided. The system includes a memory encoding processor-executable routines. The system also includes a processor configured to access the memory and to execute the processor-executable routines, wherein the routines, when executed by the processor, cause the processor to perform actions. The actions include acquiring a plurality of blades of k-space data of a region of interest in a rotational manner around a center of k-space via a magnetic resonance imaging (MRI) scanner from a coil during a PROPELLER sequence, wherein each blade of the plurality of blades of k-space data includes a plurality of parallel phase encoding lines sampled in a phase encoding order. The actions also include utilizing a deep learning-based denoising network to denoise each blade of the plurality of blades of k-space data to generate a plurality of denoised blades. The actions further include utilizing a PROPELLER reconstruction algorithm to generate a complex image from the plurality of denoised blades.

In one embodiment, the plurality of blades of k-space data is acquired from a single channel of the coil.

In one embodiment, the plurality of blades of k-space data is acquired from a plurality of channels of the coil.

In one embodiment, the actions further include combining, via the processor, the plurality of blades of k-space data acquired from the plurality of channels prior to utilizing the deep learning-based denoising network to denoise each blade of the plurality of blades of k-space data.

In one embodiment, the actions further include utilizing, via the processor, a deep learning-based de-streaking network on the complex image to remove streaks.

In one embodiment, the actions further include training, via the processor, the deep learning-based denoising network on input-output data pairs utilizing supervised learning. The input-output data pairs include near perfect and conventional MR images simulated from natural images. The deep-learning-based denoising network is trained to predict noise in Cartesian acquired images.

In one embodiment, at least some pairs of simulated images include skewed aspect ratios.

In a further embodiment, a non-transitory computer-readable medium, the computer-readable medium including processor-executable code that when executed by a processor, causes the processor to perform actions. The actions include acquiring a plurality of blades of k-space data of a region of interest in a rotational manner around a center of k-space via a magnetic resonance imaging (MRI) scanner from a coil during a PROPELLER sequence, wherein each blade of the plurality of blades of k-space data includes a plurality of parallel phase encoding lines sampled in a phase encoding order. The actions also include utilizing a deep learning-based denoising network to denoise each blade of the plurality of blades of k-space data to generate a plurality of denoised blades. The actions further include utilizing a PROPELLER reconstruction algorithm to generate a complex image from the plurality of denoised blades.

In one embodiment, the plurality of blades of k-space data is acquired from a single channel of the coil.

In one embodiment, the plurality of blades of k-space data is acquired from a plurality of channels of the coil.

In one embodiment, the actions further include combining, via the processor, the plurality of blades of k-space data acquired from the plurality of channels prior to utilizing the deep learning-based denoising network to denoise each blade of the plurality of blades of k-space data.

In one embodiment, the actions further include utilizing, via the processor, a deep learning-based de-streaking network on the complex image to remove streaks.

In one embodiment, the actions further include training, via the processor, the deep learning-based denoising network on input-output data pairs utilizing supervised learning. The input-output data pairs include near perfect and conventional MR images simulated from natural images. The deep-learning-based denoising network is trained to predict noise in Cartesian acquired images.

In one embodiment, at least some pairs of simulated images include skewed aspect ratios.

BRIEF DESCRIPTION OF THE DRAWINGS

These and other features, aspects, and advantages of the present subject matter will become better understood when the following detailed description is read with reference to the accompanying drawings in which like characters represent like parts throughout the drawings, wherein.

DETAILED DESCRIPTION

Figure 1:
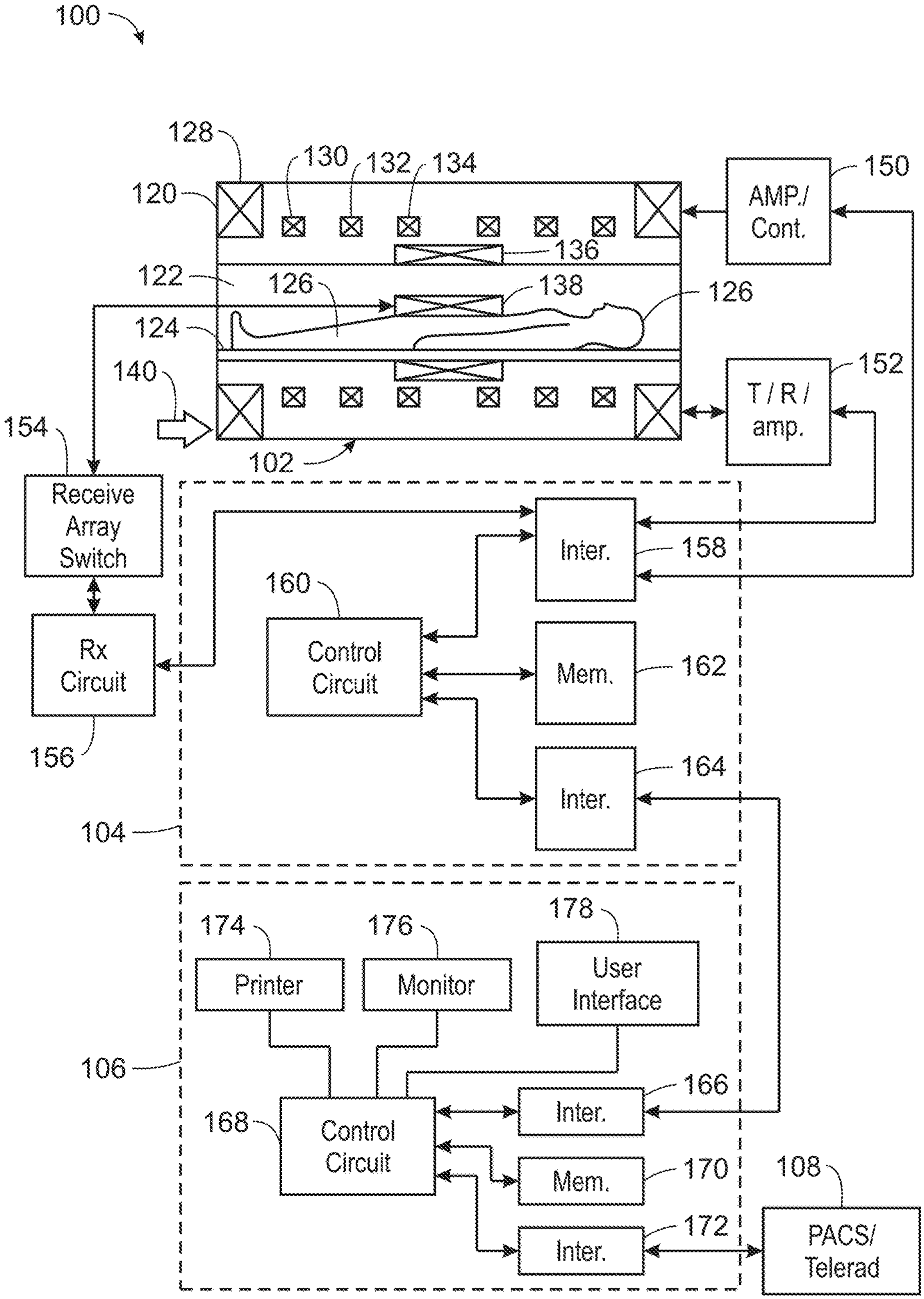
FIG. 1 illustrates an embodiment of a magnetic resonance imaging (MRI) system suitable for use with the disclosed technique.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present subject matter, the articles "a," "an," "the," and "said" are intended to mean that there are one or more of the elements. The terms "comprising," "including," and "having" are intended to be inclusive and mean that there may be additional elements other than the listed elements. Furthermore, any numerical examples in the following discussion are intended to be non-limiting, and thus additional numerical values, ranges, and percentages are within the scope of the disclosed embodiments.

While aspects of the following discussion are provided in the context of medical imaging, it should be appreciated that the disclosed techniques are not limited to such medical contexts. Indeed, the provision of examples and explanations in such a medical context is only to facilitate explanation by providing instances of real-world implementations and applications. However, the disclosed techniques may also be utilized in other contexts, such as image reconstruction for non-destructive inspection of manufactured parts or goods (i.e., quality control or quality review applications), and/or the non-invasive inspection of packages, boxes, luggage, and so forth (i.e., security or screening applications). In general, the disclosed techniques may be useful in any imaging or screening context or image processing or photography field where a set or type of acquired data undergoes a reconstruction process to generate an image or volume.

Deep learning (DL) approaches discussed herein may be based on artificial neural networks, and may therefore encompass one or more of deep neural networks, fully connected networks, convolutional neural networks (CNNs), unrolled neural networks, perceptrons, encoders-decoders, recurrent networks, transformer networks, wavelet filter banks, u-nets, general adversarial networks (GANs), dense neural networks (e.g., residual dense networks (RDNs), or other neural network architectures. The neural networks may include shortcuts, activations, batch-normalization layers, and/or other features. These techniques are referred to herein as DL techniques, though this terminology may also be used specifically in reference to the use of deep neural networks, which is a neural network having a plurality of layers.

As discussed herein, DL techniques (which may also be known as deep machine learning, hierarchical learning, or deep structured learning) are a branch of machine learning techniques that employ mathematical representations of data and artificial neural networks for learning and processing such representations. By way of example, DL approaches may be characterized by their use of one or more algorithms to extract or model high level abstractions of a type of data-of-interest. This may be accomplished using one or more processing layers, with each layer typically corresponding to a different level of abstraction and, therefore potentially employing or utilizing different aspects of the initial data or outputs of a preceding layer (i.e., a hierarchy or cascade of layers) as the target of the processes or algorithms of a given layer. In an image processing or reconstruction context, this may be characterized as different layers corresponding to the different feature levels or resolution in the data. In general, the processing from one representation space to the next-level representation space can be considered as one 'stage' of the process. Each stage of the process can be performed by separate neural networks or by different parts of one larger neural network.

In magnetic resonance imaging, noise is Gaussian in the acquired complex k-space as well as in the complex image. Periodically rotated overlapping parallel lines with enhanced reconstruction (PROPELLER) is an MR technique which provides high resolution magnetic resonance imaging with reduced motion artifacts by providing the capability to remove motion affected blades and by oversampling the low spatial frequencies. In PROPELLER, overlapping blades are acquired rotated around the k-space. Thus, the noise remains Gaussian in the blades. However, to obtain the end image, the blades need to be phase corrected and then gridded into uniform k-space coordinates (i.e., a Cartesian matrix), which causes the noise to become colored. Typically, denoising is performed after generating the complex image (when the noise is colored). But denoising models have been observed to perform better with Gaussian noise than colored noise. Attempts at denoising colored noise are reported to produce blurriness and degraded image quality. The denoising performance becomes drastically worse in the case of low signal-to-noise ratio data.

The present disclosure provides systems and methods for improving image quality of periodically rotated overlapping parallel lines with enhanced reconstruction (PROPELLER) imaging. In particular, the present disclosure provides for denoising individual blades of k-space data prior to phase correcting and gridding the blades of k-space data (where the noise is still Gaussian).

The disclosed systems and methods include acquiring a plurality of blades of k-space data of a region of interest in a rotational manner around a center of k-space via a magnetic resonance imaging (MRI) scanner from a coil during a PROPELLER sequence, wherein each blade of the plurality of blades of k-space data includes a plurality of parallel phase encoding lines sampled in a phase encoding order. The disclosed systems and methods also include utilizing a deep learning-based denoising network to denoise each blade of the plurality of blades of k-space data to generate a plurality of denoised blades. The disclosed systems and methods further include utilizing a PROPELLER reconstruction algorithm to generate a complex image from the plurality of denoised blades. In certain embodiments, the plurality of blades of k-space data is acquired from a single channel of the coil. In certain embodiments, the plurality of blades of k-space data is acquired from a plurality of channels of the coil. In these embodiments, the disclosed systems and methods include combining the plurality of blades of k-space data acquired from the plurality of channels prior to utilizing the deep learning-based denoising network to denoise each blade of the plurality of blades of k-space data. In certain embodiments, the disclosed systems and methods include utilizing a deep learning-based de-streaking network on the complex image to remove streaks. In certain embodiments, the disclosed systems and methods also include applying super-resolution to the complex image to generate a higher resolution complex image that is further denoised (e.g., free of blur). In certain embodiments, the complex image may be subject to other post-processing. In certain embodiments, the disclosed systems and methods further include writing the image to a DICOM file (e.g., for viewing or storage).

In certain embodiments, the disclosed systems and method include training the deep learning-based denoising network on input-output data pairs utilizing supervised learning. The input-output data pairs include near perfect and conventional MRI like images simulated from natural images. The deep learning-based denoising network is trained to predict noise in Cartesian acquired images. In certain embodiments, at least some pairs of the simulated images have skewed aspect ratios to improve the denoising function of the deep learning-based denoising network.

PROPELLER is generally used to suppress motion. Also, to suppress motion PROPELLER might be accelerated but this decreases the signal-to-noise ratio. Further, if the imaging system is further de-rated (with regard to number of coils and field-strength utilized), the signal-to-noise ratio falls below diagnosable quality. The disclosed systems and methods improve image quality in with regard to both signal-to-noise ratio and sharpness.

With the preceding in mind, FIG. 1 a magnetic resonance imaging (MRI) system 100 is illustrated schematically as including a scanner 102, scanner control circuitry 104, and system control circuitry 106. According to the embodiments described herein, the magnetic resonance imaging system 100 is generally configured to perform magnetic resonance imaging.

System 100 additionally includes remote access and storage systems or devices such as picture archiving and communication systems (PACS) 108, or other devices such as teleradiology equipment so that data acquired by the system 100 may be accessed on- or off-site. In this way, MR data may be acquired, followed by on- or off-site processing and evaluation. While the magnetic resonance imaging system 100 may include any suitable scanner or detector, in the illustrated embodiment, the system 100 includes a full body scanner 102 having a housing 120 through which a bore 122 is formed. A table 124 is moveable into the bore 122 to permit a patient 126 (e.g., subject) to be positioned therein for imaging selected anatomy within the patient.

Scanner 102 includes a series of associated coils for producing controlled magnetic fields for exciting the gyromagnetic material within the anatomy of the patient being imaged. Specifically, a primary magnet coil 128 is provided for generating a primary magnetic field, $B_0$, which is generally aligned with the bore 122. A series of gradient coils 130, 132, and 134 permit controlled magnetic gradient fields to be generated for positional encoding of certain gyromagnetic nuclei within the patient 126 during examination sequences. A radio frequency (RF) coil 136 (e.g., RF transmit coil) is configured to generate radio frequency pulses for exciting the certain gyromagnetic nuclei within the patient. In addition to the coils that may be local to the scanner 102, the system 100 also includes a set of receiving coils or RF receiving coils 138 (e.g., an array of coils) configured for placement proximal (e.g., against) to the patient 126. As an example, the receiving coils 138 can include cervical/thoracic/lumbar (CTL) coils, head coils, single-sided spine coils, and so forth. Generally, the receiving coils 138 are placed close to or on top of the patient 126 so as to receive the weak RF signals (weak relative to the transmitted pulses generated by the scanner coils) that are generated by certain gyromagnetic nuclei within the patient 126 as they return to their relaxed state.

The various coils of system 100 are controlled by external circuitry to generate the desired field and pulses, and to read emissions from the gyromagnetic material in a controlled manner. In the illustrated embodiment, a main power supply 140 provides power to the primary field coil 128 to generate the primary magnetic field, $B_0$. A power input (e.g., power from a utility or grid), a power distribution unit (PDU), a power supply (PS), and a driver circuit 150 may together provide power to pulse the gradient field coils 130, 132, and 134. The driver circuit 150 may include amplification and control circuitry for supplying current to the coils as defined by digitized pulse sequences output by the scanner control circuitry 104.

Another control circuit 152 is provided for regulating operation of the RF coil 136. Circuit 152 includes a switching device for alternating between the active and inactive modes of operation, wherein the RF coil 136 transmits and does not transmit signals, respectively. Circuit 152 also includes amplification circuitry configured to generate the RF pulses. Similarly, the receiving coils 138 are connected to switch 154, which is capable of switching the receiving coils 138 between receiving and non-receiving modes. Thus, the receiving coils 138 resonate with the RF signals produced by relaxing gyromagnetic nuclei from within the patient 126 while in the receiving mode, and they do not resonate with RF energy from the transmitting coils (i.e., coil 136) so as to prevent undesirable operation while in the non-receiving mode. Additionally, a receiving circuit 156 is configured to receive the data detected by the receiving coils 138 and may include one or more multiplexing and/or amplification circuits.

It should be noted that while the scanner 102 and the control/amplification circuitry described above are illustrated as being coupled by a single line, many such lines may be present in an actual instantiation. For example, separate lines may be used for control, data communication, power transmission, and so on. Further, suitable hardware may be disposed along each type of line for the proper handling of the data and current/voltage. Indeed, various filters, digitizers, and processors may be disposed between the scanner and either or both of the scanner and system control circuitry 104, 106.

As illustrated, scanner control circuitry 104 includes an interface circuit 158, which outputs signals for driving the gradient field coils and the RF coil and for receiving the data representative of the magnetic resonance signals produced in examination sequences. The interface circuit 158 is coupled to a control and analysis circuit 160. The control and analysis circuit 160 executes the commands for driving the circuit 150 and circuit 152 based on defined protocols selected via system control circuit 106.

Control and analysis circuit 160 also serves to receive the magnetic resonance signals and performs subsequent processing before transmitting the data to system control circuit 106. Scanner control circuit 104 also includes one or more memory circuits 162, which store configuration parameters, pulse sequence descriptions, examination results, and so forth, during operation.

Interface circuit 164 is coupled to the control and analysis circuit 160 for exchanging data between scanner control circuitry 104 and system control circuitry 106. In certain embodiments, the control and analysis circuit 160, while illustrated as a single unit, may include one or more hardware devices. The system control circuit 106 includes an interface circuit 166, which receives data from the scanner control circuitry 104 and transmits data and commands back to the scanner control circuitry 104. The control and analysis circuit 168 may include a CPU in a multi-purpose or application specific computer or workstation. Control and analysis circuit 168 is coupled to a memory circuit 170 to store programming code for operation of the magnetic resonance imaging system 100 and to store the processed image data for later reconstruction, display and transmission. The programming code may execute one or more algorithms that, when executed by a processor, are configured to perform reconstruction of acquired data as described below. In certain embodiments, the memory circuit 170 may store one or more neural networks for processing and/or reconstruction of acquired data (e.g., deep learning-based denoising network, deep learning-based de-streaking network, etc.) as described below. In certain embodiments, image reconstruction may occur on a separate computing device having processing circuitry and memory circuitry.

A processing component (e.g., a microprocessor or processing circuitry) and a memory of the magnetic resonance imaging system 100, such as may be present in scanner control circuitry 104 and/or system control circuitry 106, may be used to execute stored software code, instructions, or routines for acquiring and processing the MR data. The term "code" or "software code" used herein refers to any instructions or set of instructions that control the magnetic resonance imaging system 100. The code or software code may exist in a computer-executable form, such as machine code, which is the set of instructions and data directly executed by the processing component of the scanner control circuitry 104 and/or system control circuitry 106, human-understandable form, such as source code, which may be compiled in order to be executed by the processing component of the scanner control circuitry 104 and/or system control circuitry 106, or an intermediate form, such as object code, which is produced by a compiler. In some embodiments, the magnetic resonance imaging system 100 may include a plurality of controllers.

As an example, the memory may store processor-executable software code or instructions (e.g., firmware or software), which are tangibly stored on a non-transitory computer readable medium. Additionally or alternatively, the memory 46 may store data. As an example, the memory may include a volatile memory, such as random access memory (RAM), and/or a nonvolatile memory, such as read-only memory (ROM), flash memory, a hard drive, or any other suitable optical, magnetic, or solid-state storage medium, or a combination thereof. Furthermore, processing component may include multiple microprocessors, one or more "general-purpose" microprocessors, one or more special-purpose microprocessors, and/or one or more application specific integrated circuits (ASICS), or some combination thereof. For example, the processing component may include one or more reduced instruction set (RISC) or complex instruction set (CISC) processors. The processing component may include multiple processors, and/or the memory may include multiple memory devices.

In certain embodiments, the processor may be configured to acquire a plurality of blades of k-space data of a region of interest in a rotational manner around a center of k-space via a magnetic resonance imaging (MRI) scanner from a coil during a PROPELLER sequence, wherein each blade of the plurality of blades of k-space data includes a plurality of parallel phase encoding lines sampled in a phase encoding order. The processor may also be configured to utilize a deep learning-based denoising network to denoise each blade of the plurality of blades of k-space data to generate a plurality of denoised blades. The processor may further be configured to utilize a PROPELLER reconstruction algorithm to generate a complex image from the plurality of denoised blades. In certain embodiments, where the plurality of blades of k-space data is acquired from a plurality of channels of the coil, the processor may even further be configured to combine the plurality of blades of k-space data acquired from the plurality of channels prior to utilizing the deep learning-based denoising network to denoise each blade of the plurality of blades of k-space data. In certain embodiments, the processor may yet further be configured to utilize a deep learning-based de-streaking network on the complex image to remove streaks. In certain embodiments, the processor may apply super-resolution to the complex image to generate a higher resolution complex image that is further denoised (e.g., free of blur). In certain embodiments, the complex image may be subject to other post-processing. In certain embodiments, the processor may write the image to a DICOM file (e.g., for viewing or storage).

In certain embodiments, the processor may also be configured to train the deep learning-based denoising network on input-output data pairs utilizing supervised learning. The input-output data pairs include near perfect and conventional MR images simulated from natural images. The deep learning-based denoising network is trained to predict noise in Cartesian acquired images. In certain embodiments, at least some pairs of simulated images have skewed aspect ratios to improve the denoising function of the deep learning-based denoising network.

An additional interface circuit 172 may be provided for exchanging image data, configuration parameters, and so forth with external system components such as remote access and storage devices 108. Finally, the system control and analysis circuit 168 may be communicatively coupled to various peripheral devices for facilitating operator interface and for producing hard copies of the reconstructed images. In the illustrated embodiment, these peripherals include a printer 174, a monitor 176, and user interface 178 including devices such as a keyboard, a mouse, a touchscreen (e.g., integrated with the monitor 176), and so forth.

Figure 2:
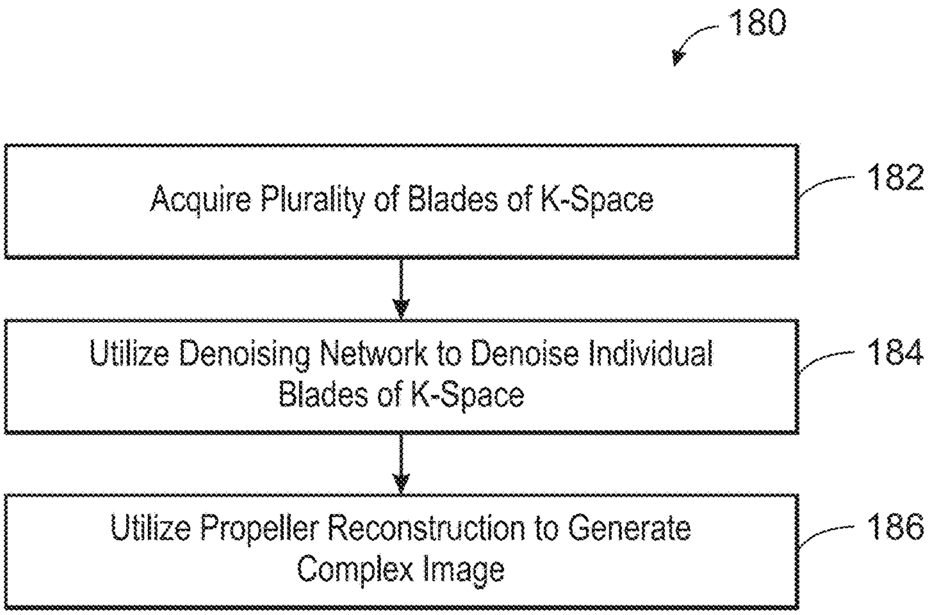
FIG. 2 illustrates a flow chart of a method for improving image quality of periodically rotated overlapping parallel lines with enhanced reconstruction (PROPELLER) imaging (e.g., utilizing data from a single channel), in accordance with aspects of the present disclosure.

FIG. 2 is a flow chart of a method 180 for improving image quality of PROPELLER imaging. One or more steps of the method 180 may be performed by processing circuitry of the magnetic resonance imaging system 100 in FIG. 1 or a remote computing system. For example, the processing circuitry may part of the scanner control circuitry 104 and/or system control circuitry 106 of the magnetic resonance imaging system 100. One or more steps of the method 180 may be performed simultaneously and/or in a different order shown in FIG. 2. The method 180 is performed on data acquired from a single channel of a coil (e.g., RF reeving coil such as a body coil).

The method 180 includes acquiring a plurality of blades of k-space data of a region of interest in a rotational manner (e.g., rotated approximately 10 to 20 degrees between blade acquisitions) around a center of k-space via a magnetic resonance imaging scanner (e.g., magnetic resonance imaging scanner 102 in FIG. 1) from a coil (e.g., RF receiving coil such as a body coil) during a PROPELLER sequence (block 182). Each blade of the plurality of blades of k-space data includes a plurality of parallel phase encoding lines sampled in a phase encoding order (e.g., having a rectilinear shape) using fast spin echo or gradient echo methods (i.e., each blade is filled by an echo train of a respective MR pulse sequence). The method 180 also includes utilizing a deep learning-based denoising network or model to denoise each blade (e.g., individually) of the plurality of blades of k-space data to generate a plurality of denoised blades (block 184). The deep learning-based denoising network is trained to predict noise present in a Cartesian acquisition image (e.g., MR image). The deep learning-based denoising network is built to be size invariant. The training of the deep learning-based denoising network is described below in FIG. 5. The method 180 further includes utilizing a PROPELLER reconstruction algorithm (as described below in FIG. 4) to generate a complex image of the region of interest from the plurality of denoised blades (block 186). For example, the PROPELLER reconstruction algorithm includes phase correction for each blade to assure its point of rotation is exactly at the center of k-space, corrections for bulk in-plane rotation and in-plane translation of the object, and correlation-weighting to minimize the data from blades containing motion or displacement errors. In certain embodiments, the complex image be further processed (as described below in FIG. 4) prior to writing the image into a Digital Imaging and Communications in Medicine (DICOM) file.

Figure 3:
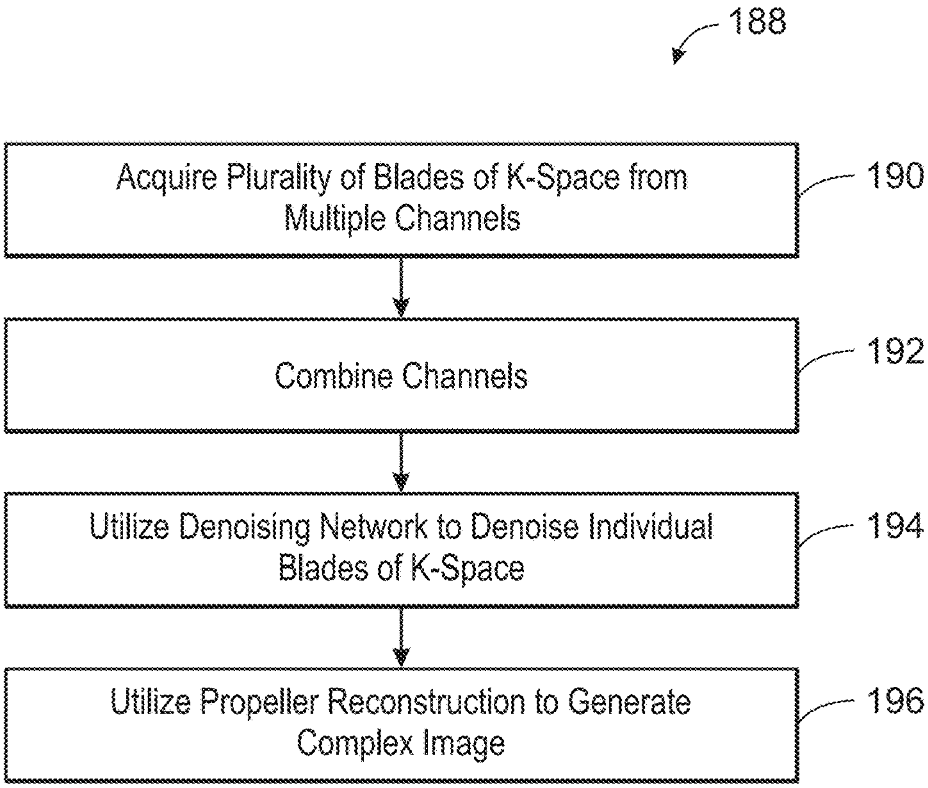
FIG. 3 illustrates a flow chart of a method for improving image quality of periodically rotated overlapping parallel lines with enhanced reconstruction (PROPELLER) imaging (e.g., utilizing data from multiple channels), in accordance with aspects of the present disclosure.

FIG. 3 is a flow chart of a method 188 for improving image quality of PROPELLER imaging (e.g., utilizing data from multiple channels). One or more steps of the method 188 may be performed by processing circuitry of the magnetic resonance imaging system 100 in FIG. 1 or a remote computing system. For example, the processing circuitry may part of the scanner control circuitry 104 and/or system control circuitry 106 of the magnetic resonance imaging system 100. One or more steps of the method 188 may be performed simultaneously and/or in a different order shown in FIG. 3. The method 188 is performed on data acquired from a plurality of channels of a coil (e.g., RF reeving coil such as a body coil).

The method 188 includes acquiring a plurality of blades of k-space data (e.g., from multiple channels) of a region of interest in a rotational manner (e.g., rotated approximately 10 to 20 degrees between blade acquisitions) around a center of k-space via a magnetic resonance imaging scanner (e.g., magnetic resonance imaging scanner 102 in FIG. 1) from a coil (e.g., RF receiving coil such as a body coil) during a PROPELLER sequence (block 190). Each blade of the plurality of blades of k-space data includes a plurality of parallel phase encoding lines sampled in a phase encoding order (e.g., having a rectilinear shape) using fast spin echo or gradient echo methods i.e., each blade is filled by an echo train of a respective MR pulse sequence). The method 188 also includes combining the plurality of blades of k-space data acquired from the plurality of channels prior to utilizing the deep learning-based denoising network to denoise each blade of the plurality of blades of k-space data (i.e., corresponding blades of k-space data from the channels are combined) (block 192).

The method 188 also includes utilizing a deep learning-based denoising network or model to denoise each blade (e.g., combined blade) of the plurality of blades of k-space data to generate a plurality of denoised blades (block 194). The deep learning-based denoising network is trained to predict noise present in a Cartesian acquisition image (e.g., MR image). The deep learning-based denoising network is built to be size invariant. The training of the deep learning-based denoising network is described below in FIG. 5. The method 188 further includes utilizing a PROPELLER reconstruction algorithm (as described below in FIG. 4) to generate a complex image of the region of interest from the plurality of denoised blades (block 196). For example, the PROPELLER reconstruction algorithm includes phase correction for each blade to assure its point of rotation is exactly at the center of k-space, corrections for bulk in-plane rotation and in-plane translation of the object, and correlation-weighting to minimize the data from blades containing motion or displacement errors. In certain embodiments, the complex image be further processed (as described below in FIG. 4) prior to writing the image into a Digital Imaging and Communications in Medicine (DICOM) file.

Figure 4:
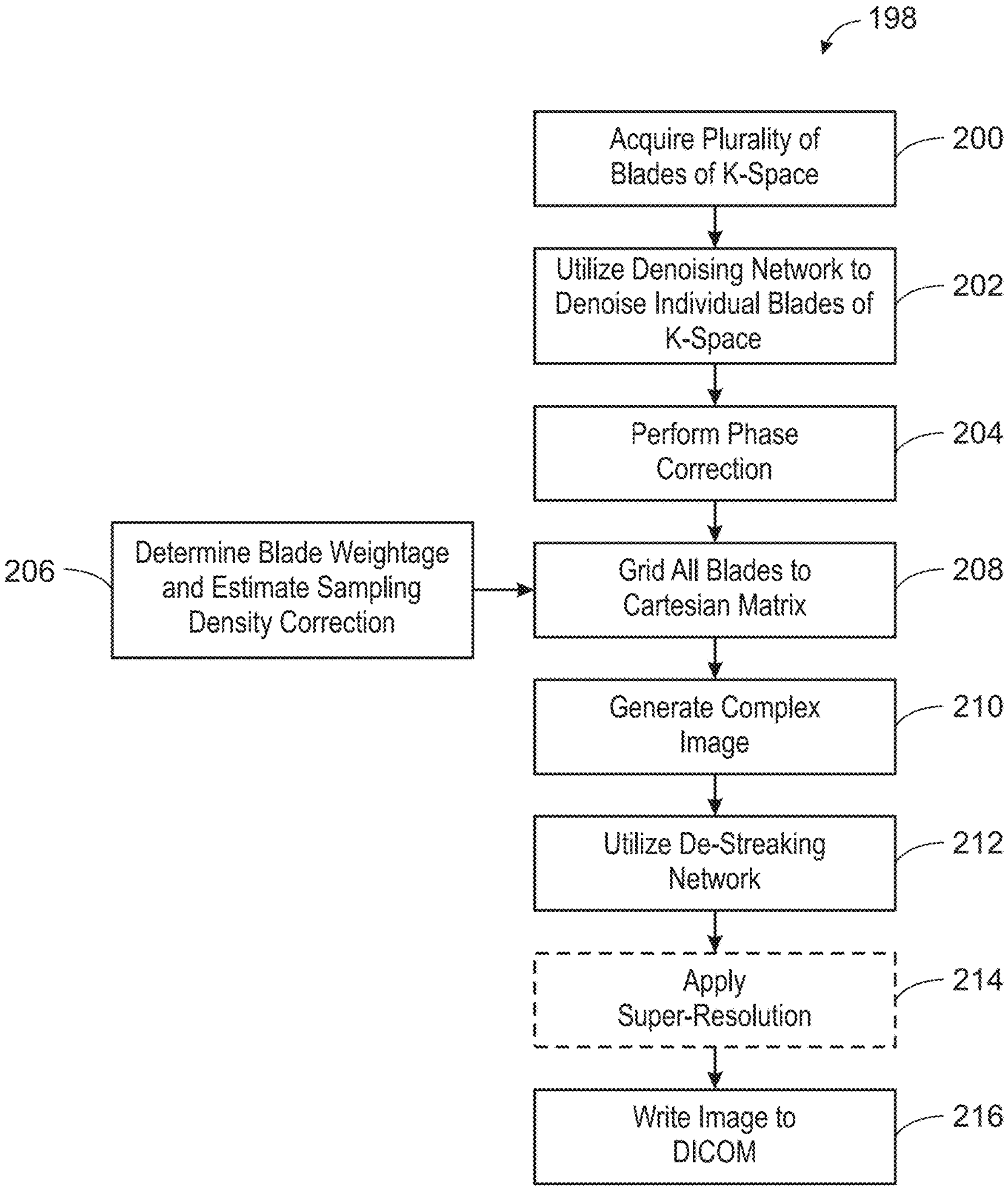
FIG. 4 illustrates a flow chart of a method for improving image quality of periodically rotated overlapping parallel lines with enhanced reconstruction (PROPELLER) imaging (e.g., with details of PROPELLER reconstruction), in accordance with aspects of the present disclosure.

FIG. 4 is a flow chart of a method 198 for improving image quality of PROPELLER imaging (e.g., with details of PROPELLER reconstruction). One or more steps of the method 198 may be performed by processing circuitry of the magnetic resonance imaging system 100 in FIG. 1 or a remote computing system. For example, the processing circuitry may part of the scanner control circuitry 104 and/or system control circuitry 106 of the magnetic resonance imaging system 100. One or more steps of the method 198 may be performed simultaneously and/or in a different order shown in FIG. 4. The method 198 is performed on data acquired from either a single channel (e.g., as described in the method 180 in FIG. 2) or a plurality of channels (e.g., as described in the method 188 in FIG. 3) of a coil (e.g., RF reeving coil such as a body coil).

The method 198 includes acquiring a plurality of blades of k-space data (e.g., from a single channel or multiple channels) of a region of interest in a rotational manner (e.g., rotated approximately 10 to 20 degrees between blade acquisitions) around a center of k-space via a magnetic resonance imaging scanner (e.g., magnetic resonance imaging scanner 102 in FIG. 1) from a coil (e.g., RF receiving coil such as a body coil) during a PROPELLER sequence (block 200). Each blade of the plurality of blades of k-space data includes a plurality of parallel phase encoding lines sampled in a phase encoding order (e.g., having a rectilinear shape) using fast spin echo or gradient echo methods (i.e., each blade is filled by an echo train of a respective MR pulse sequence).

The method 198 also includes utilizing a deep learning-based denoising network or model to denoise each blade (or each combined blade) of the plurality of blades of k-space data to generate a plurality of denoised blades (block 202). The deep learning-based denoising network is trained to predict noise present in a Cartesian acquisition image (e.g., MR image). The deep learning-based denoising network is built to be size invariant. The training of the deep learning-based denoising network is described below in FIG. 5.

As noted above, the PROPELLER reconstruction algorithm includes phase correction for each blade to assure its point of rotation is exactly at the center of k-space, corrections for bulk in-plane rotation and in-plane translation of the object, and correlation-weighting to minimize the data from blades containing motion or displacement errors. The method 198 further includes performing phase correction on plurality of denoised blades (block 204). Performing phase correction for each blade assures its point of rotation is exactly at the center of k-space. The method 198 still further includes determining the weightage for each blade and estimating sampling density correction for each blade (block 206). Based on the weights and the estimated sampling density corrections to be applied to the denoised blades, the method 198 includes gridding all of the denoised blades of k-space into a Cartesian matrix (e.g., uniform k-space coordinates) (block 208). The blocks 208 and 210 of the method 198 ensure corrections for bulk in-plane rotation and in-plane translation of the object, while the correlation-weighting minimizes the data from the blades containing motion or displacement errors. The method 198 yet further includes generating a complex image from the gridded blades (block 210).

Subsequent to PROPELLER reconstruction, in certain embodiments, the method 198 includes utilizing a deep learning-based de-streaking network or model on the complex image to remove streaks (block 212). The de-streaking network is trained to remove streaks that may cause artifacts in the image. In certain embodiments, the method 198 also includes applying super-resolution to the complex image to generate a higher resolution complex image that is further denoised (e.g., free of blur) (block 214). In certain embodiments, the complex image may be subject to other post-processing. The method 198 further includes writing the image to a DICOM file (e.g., for viewing or storage) (block 216).

Figure 5:
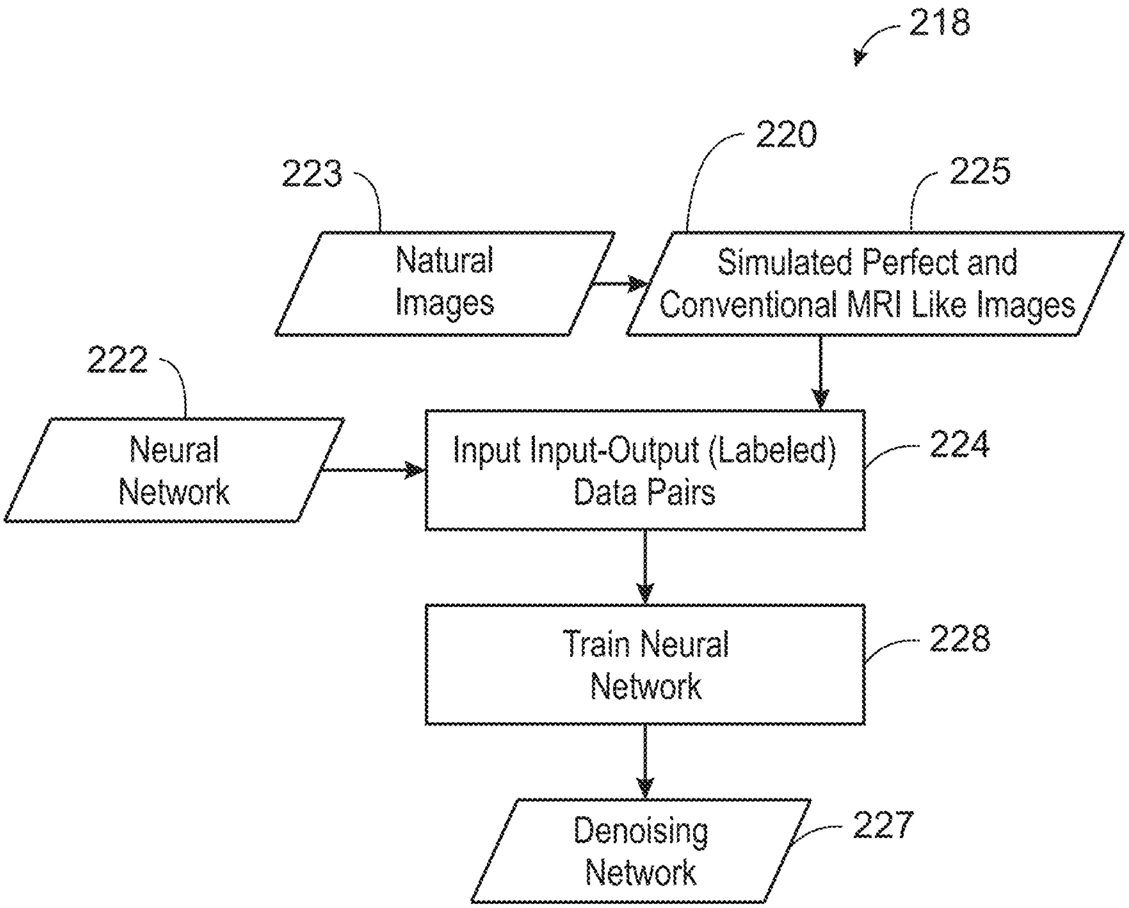
FIG. 5 illustrates a flow chart of a method for training a deep learning-based denoising network, in accordance with aspects of the present disclosure.

FIG. 5 illustrates a flow chart of a method 218 for training a deep learning-based denoising network. One or more steps of the method 218 may be performed by processing circuitry of the magnetic resonance imaging system 100 in FIG. 1 or a remote computing system. For example, the processing circuitry may part of the scanner control circuitry 104 and/or system control circuitry 106 of the magnetic resonance imaging system 100.

The method 218 includes inputting input-output (e.g., labeled) data pairs 220 into a neural network 222 (block 224). In certain embodiments, the neural network 222 is a residual dense network. In certain embodiments, input-output data pairs 220 include near perfect (i.e., sharp, lacking artifacts, and high signal-to-noise ratio) and conventional MRI like images 225 simulated from natural images 223. The method 218 also includes training the neural network 222 on the input-output data pairs 220 utilizing supervised learning to generate the deep learning-based denoising network or model 227 (block 228). In certain embodiments, at least some pairs of the input-output data pairs 220 comprise skewed aspect ratios to augment training to improve the performance of the deep learning-based denoising network 227. The deep learning-based denoising network 227 is trained to predict noise in Cartesian acquired images (e.g., MR images). Due to the training on natural images with sufficient variability and the residue to be predicted remains in the same Gaussian distribution, the deep learning-based can be utilized on blade level images. In certain embodiments, the images of the input-output data pairs 220 may be 256×256. However, the deep learning-based denoising network 227 is built to be size invariant.

Figure 6:
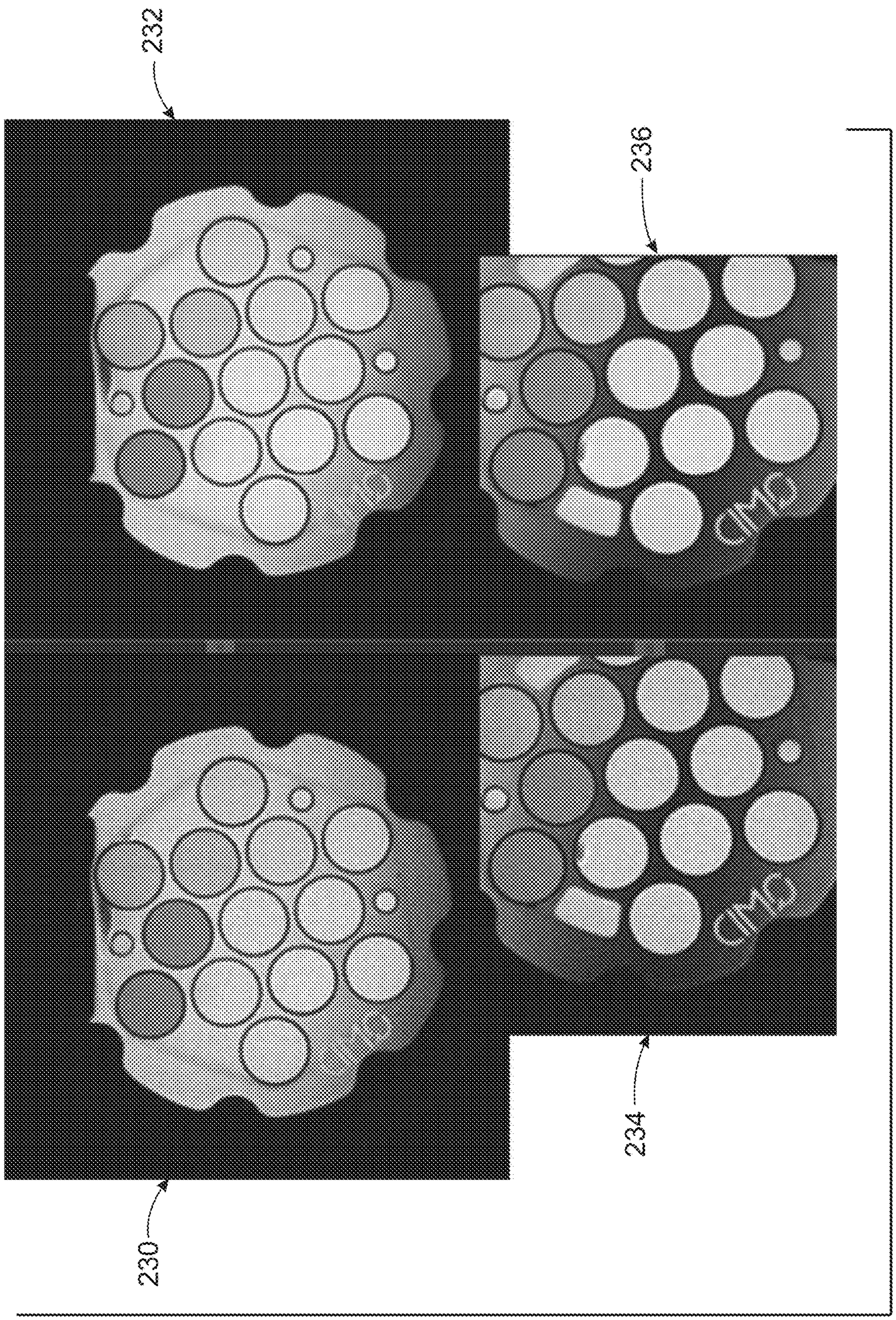
FIG. 6 depicts periodically rotated overlapping parallel lines with enhanced reconstruction (PROPELLER) images of a phantom with and without blade level denoising, in accordance with aspects of the present disclosure.

FIGS. 6-14 illustrate the effectiveness of performing blade level denoising. FIG. 6 depicts PROPELLER images of a phantom with and without blade denoising. Images 230, 232, 234, and 236 were acquired of a phantom utilizing PROPELLER with a 1.5 Tesla (T) magnetic resonance imaging scanner using a body coil. Images 230 and 234 are PROPELLER images without denoising. Images 232 and 236 are the corresponding PROPELLER images with blade level denoising performed (e.g., 100 percent denoising) utilizing the deep learning-based denoising network described above. The quality (e.g., signal-to-noise ratio and sharpness) is improved in images 232 and 236 compared to the images 230 and 234.

Figure 7:
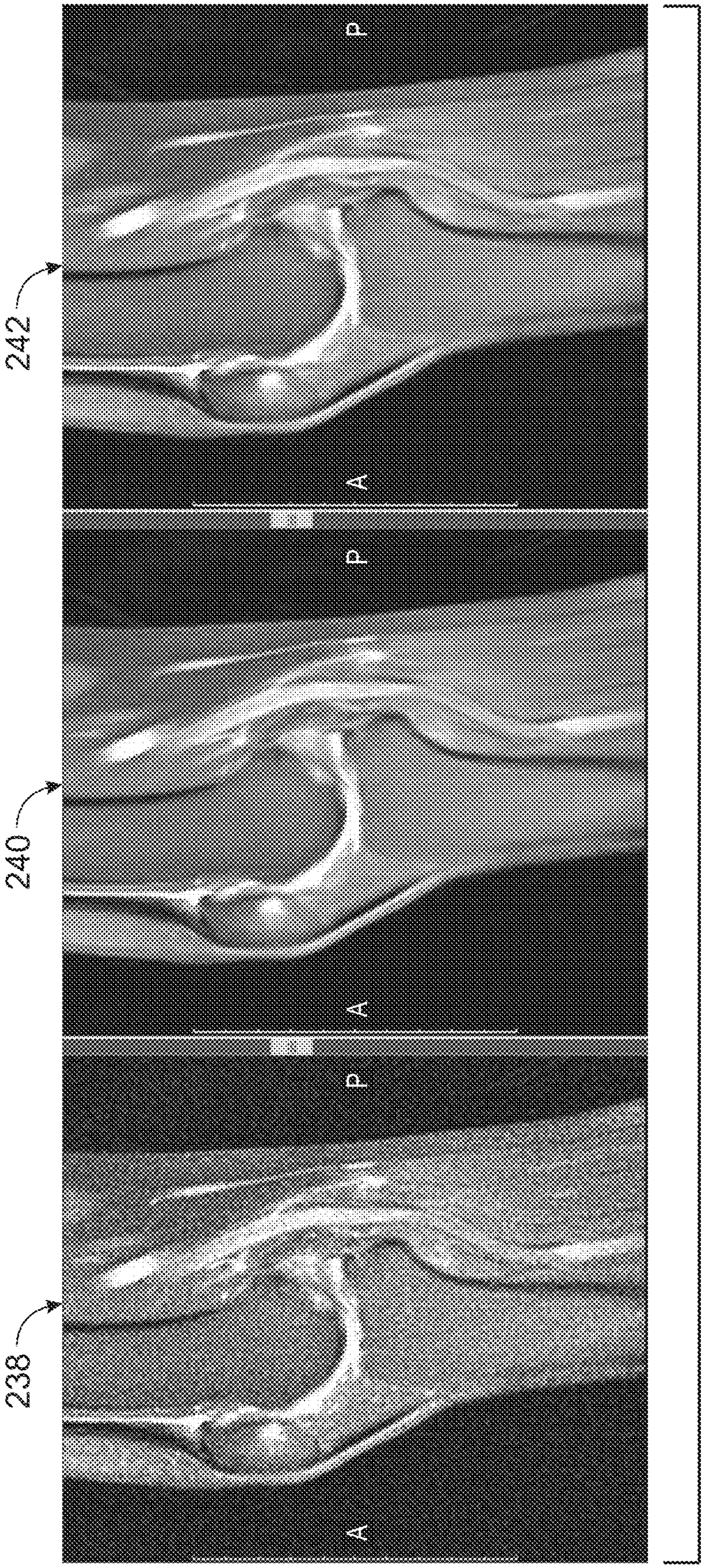
FIG. 7 depicts periodically rotated overlapping parallel lines with enhanced reconstruction (PROPELLER) images of a knee without blade level denoising and with blade level denoising with no residue and 15 percent of residue added back, in accordance with aspects of the present disclosure.

FIG. 7 depicts PROPELLER images of a knee without blade level denoising and with blade level denoising with no residue and 15 percent of residue added back. Images 238, 240, and 242 were acquired of a knee (with a proton density-weighted fat-suppressed scan) utilizing PROPELLER with a 1.5 Tesla (T) magnetic resonance imaging scanner using a body coil. Image 238 is a PROPELLER image without denoising. Image 240 is the corresponding PROPELLER image with blade level denoising performed (e.g., 100 percent denoising) utilizing the deep learning-based denoising network described above. Image 242 is the corresponding PROPELLER image with blade level nosing performed utilizing the deep learning-based denoising network described above but with 15 percent of the residue added back prior to gridding to add back texture. The quality (e.g., signal-to-noise ratio and sharpness) is improved in images 240 and 242 compared to the image 238.

Figure 8:
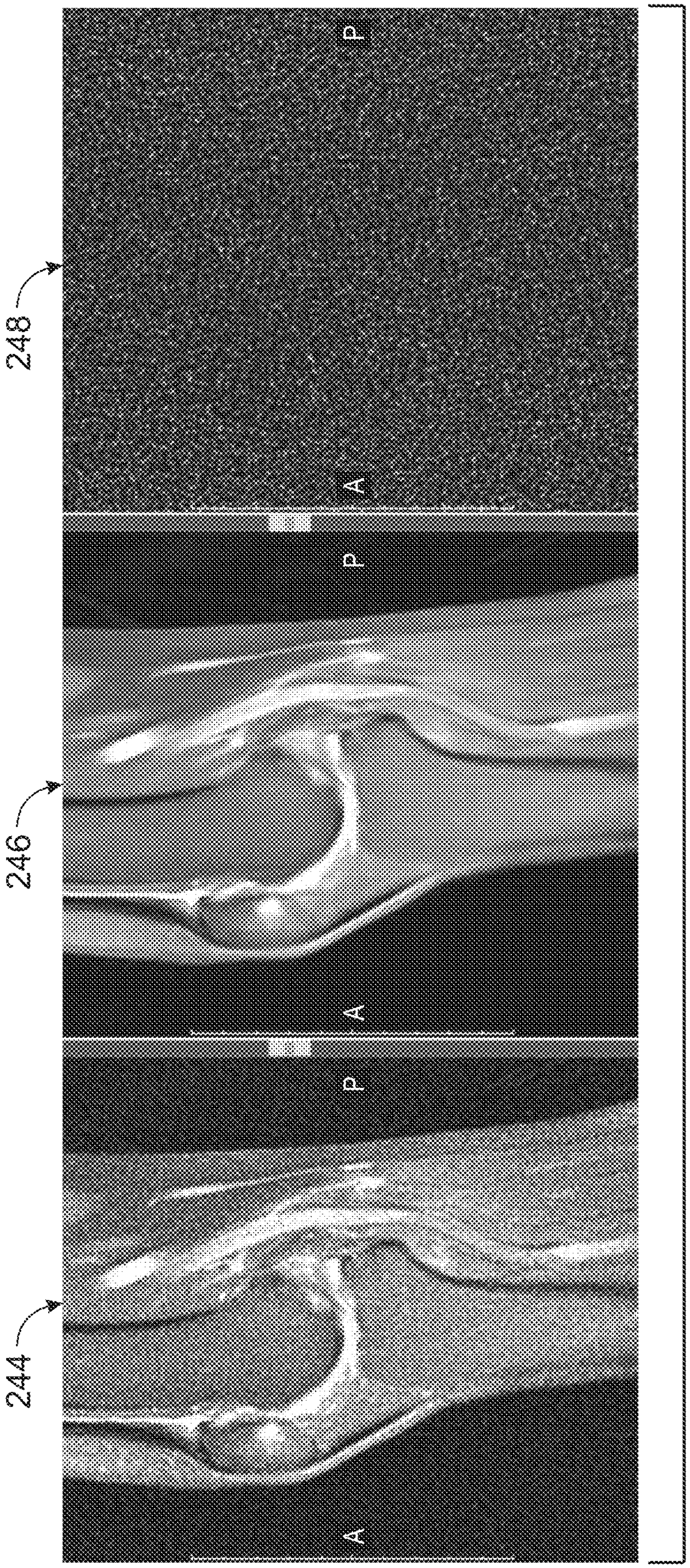
FIG. 8 depicts periodically rotated overlapping parallel lines with enhanced reconstruction (PROPELLER) images of a knee with and without blade level denoising along with an image of PROPELLER reconstruction of only residue after denoising, in accordance with aspects of the present disclosure.

FIG. 8 depicts PROPELLER images of a knee with and without blade level denoising along with an image of PROPELLER reconstruction of only residue after denoising. Images 244, 246, and 248 were acquired (with a proton density-weighted fat-suppressed scan) utilizing PROPELLER with a 1.5 Tesla (T) magnetic resonance imaging scanner using a body coil. Image 244 is a PROPELLER image without denoising. Image 246 is the corresponding PROPELLER image with blade level denoising performed (e.g., 100 percent denoising) utilizing the deep learning-based denoising network described above. Image 248 is a PROPELLER image (magnified in intensity) of the reconstruction of only the residue of all blades after denoising. The quality (e.g., signal-to-noise ratio and sharpness) is improved in image 246 compared to the image 244. Image 248 verifies that individual denoising of blades does not introduce artifacts.

Figure 9:
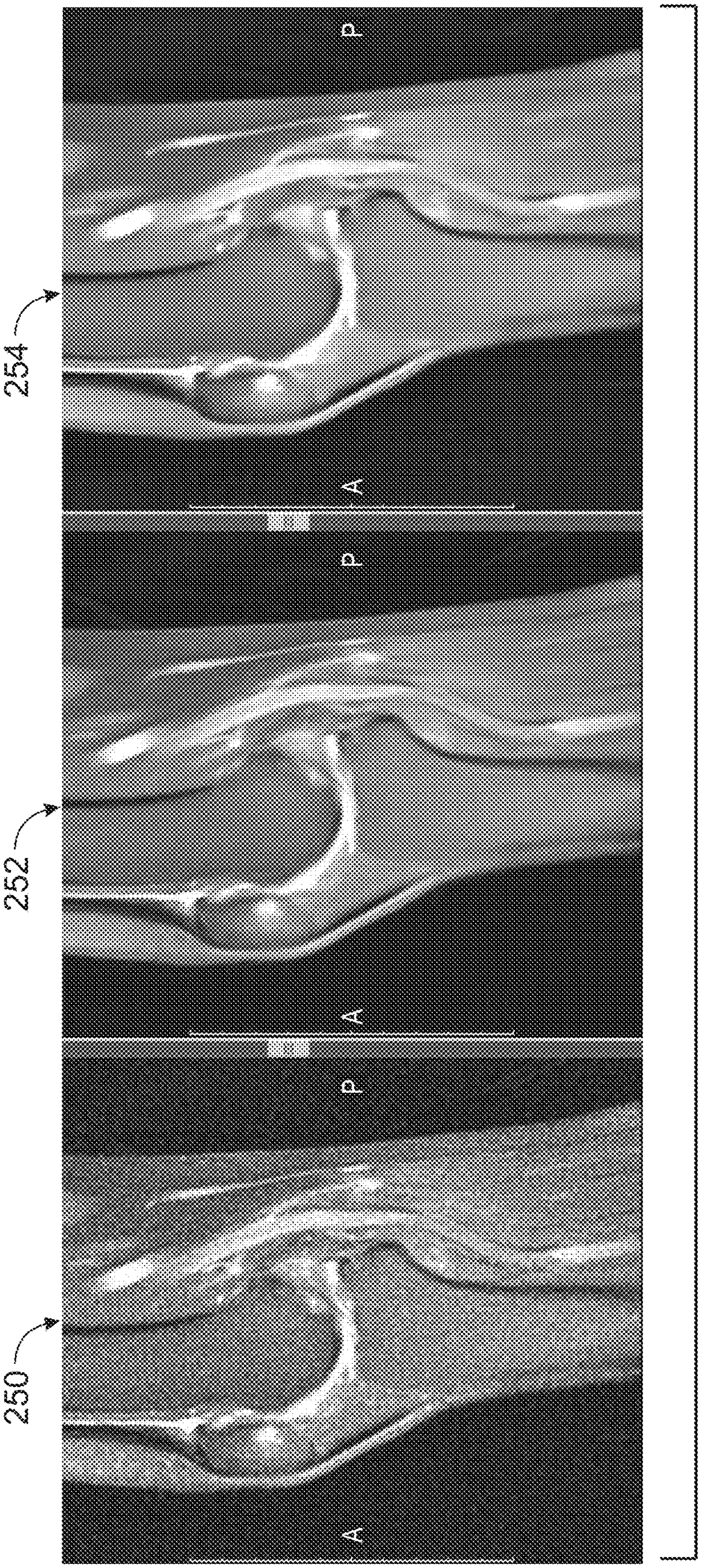
FIG. 9 depicts periodically rotated overlapping parallel lines with enhanced reconstruction (PROPELLER) images of a knee with and without blade level denoising (e.g., with denoising applied to the blades and denoising applied after gridding of the blades), in accordance with aspects of the present disclosure.

FIG. 9 depicts PROPELLER images of a knee with and without blade level denoising (e.g., with denoising applied to the blades and denoising applied after gridding of the blades). Images 250, 252, and 254 were acquired (with a proton density-weighted fat-suppressed scan) utilizing PROPELLER with a 1.5 Tesla (T) magnetic resonance imaging scanner using a body coil. Image 250 is a PROPELLER image without denoising. Image 252 is the corresponding PROPELLER image with blade level denoising performed (e.g., 100 percent denoising) utilizing the deep learning-based denoising network described above. Image 254 is a corresponding PROPELLER image with denoising of the gridded image using a residual dense network trained specifically (e.g., on trained natural images) to denoise the colored noise after found after gridding Gaussian noise. The quality is improved in image 252 relative to images 250 and 254. In addition, image 252 is sharper than image 254. Also, minor structures blurred out in the image 254 are retained in the image 252. In other words, excessive blurring was observed in image 254 compared to the image 252.

Figure 10:
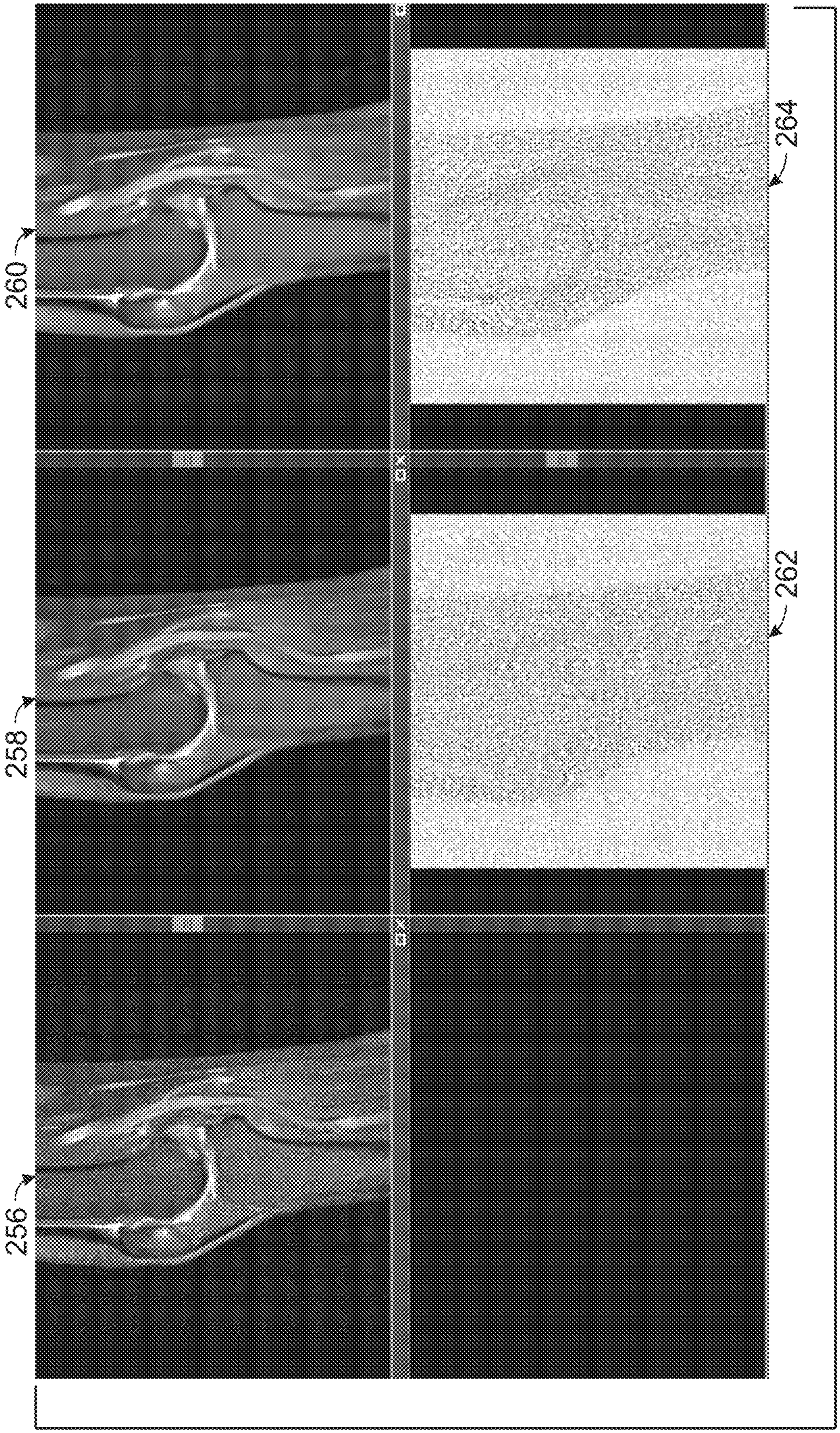
FIG. 10 depicts periodically rotated overlapping parallel lines with enhanced reconstruction (PROPELLER) images of a knee with and without blade level denoising (e.g., with denoising applied to the blades and denoising applied after gridding of the blades) along with denoised residue images, in accordance with aspects of the present disclosure.

FIG. 10 depicts PROPELLER images of a knee with and without blade level denoising (e.g., with denoising applied to the blades and denoising applied after gridding of the blades) along with denoised residue images. Images 256, 258, and 260 were acquired (with a proton density-weighted fat-suppressed scan) utilizing PROPELLER with a 1.5 Tesla (T) magnetic resonance imaging scanner using a body coil. Image 256 is a PROPELLER image without denoising. Image 258 is the corresponding PROPELLER image with blade level denoising performed (e.g., 100 percent denoising) utilizing the deep learning-based denoising network described above. Image 256 is a corresponding PROPELLER image with denoising of the gridded image using a residual dense network trained specifically (e.g., on trained natural images) to denoise the colored noise after found after gridding Gaussian noise. Image 262 is a denoised residue image between the image 256 and the image 258. Image 264 is a denoised residue image between the image the image 256 and the image 260. Structures present in the image 264 suggest that edges are blurred out in gridded level deep learning noising.

Figure 11:
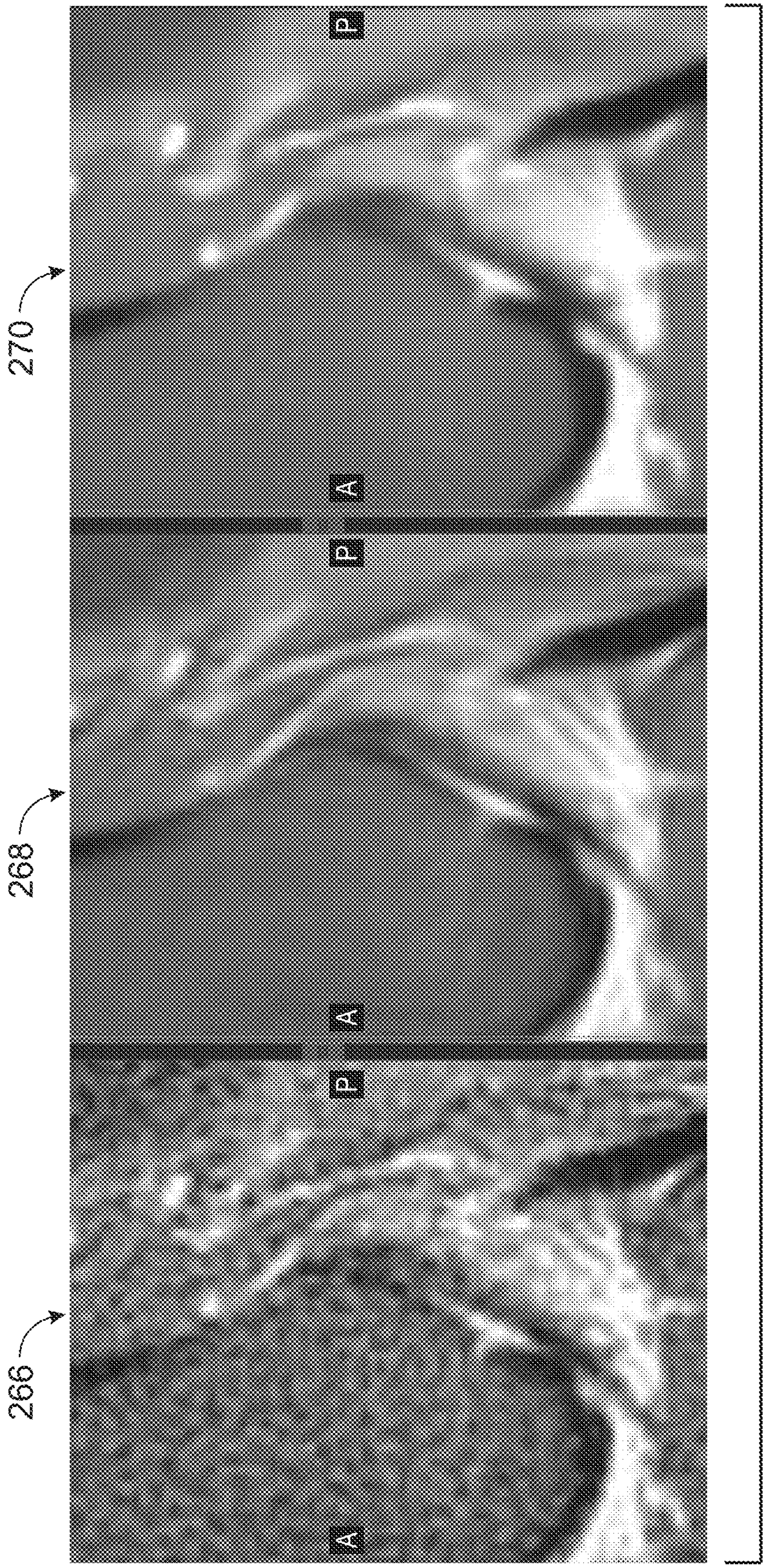
FIG. 11 depicts periodically rotated overlapping parallel lines with enhanced reconstruction (PROPELLER) images (e.g., zoomed images) of a knee with and without blade level denoising (e.g., with denoising applied to the blades and denoising applied after gridding of the blades), in accordance with aspects of the present disclosure.

FIG. 11 depicts PROPELLER images (e.g., zoomed images) of a knee with and without blade level denoising (e.g., with denoising applied to the blades and denoising applied after gridding of the blades). Images 266, 268, and 270 were acquired (with a proton density-weighted fat-suppressed scan) utilizing PROPELLER with a 1.5 Tesla (T) magnetic resonance imaging scanner using a body coil. Image 266 is a PROPELLER image without denoising that is zoomed in. Image 268 is the corresponding PROPELLER image with blade level denoising performed (e.g., 100 percent denoising) utilizing the deep learning-based denoising network described above that is zoomed in. Image 270 is a corresponding PROPELLER image (zoomed in) with denoising of the gridded image using a residual dense network trained specifically (e.g., trained natural images) to denoise the colored noise after found after gridding Gaussian noise. There are streaks present in both the image 266 (which is the source image) and image 268. But the streaks are more prominent in the image 268 than 266 due to the high noise in the source image burying it. The residual dense network used for gridded level denoising, as depicted in the image 270, aggressively denoises with this high noise level resulting in the streaks being blurred out along with edges and noise.

Figure 12:
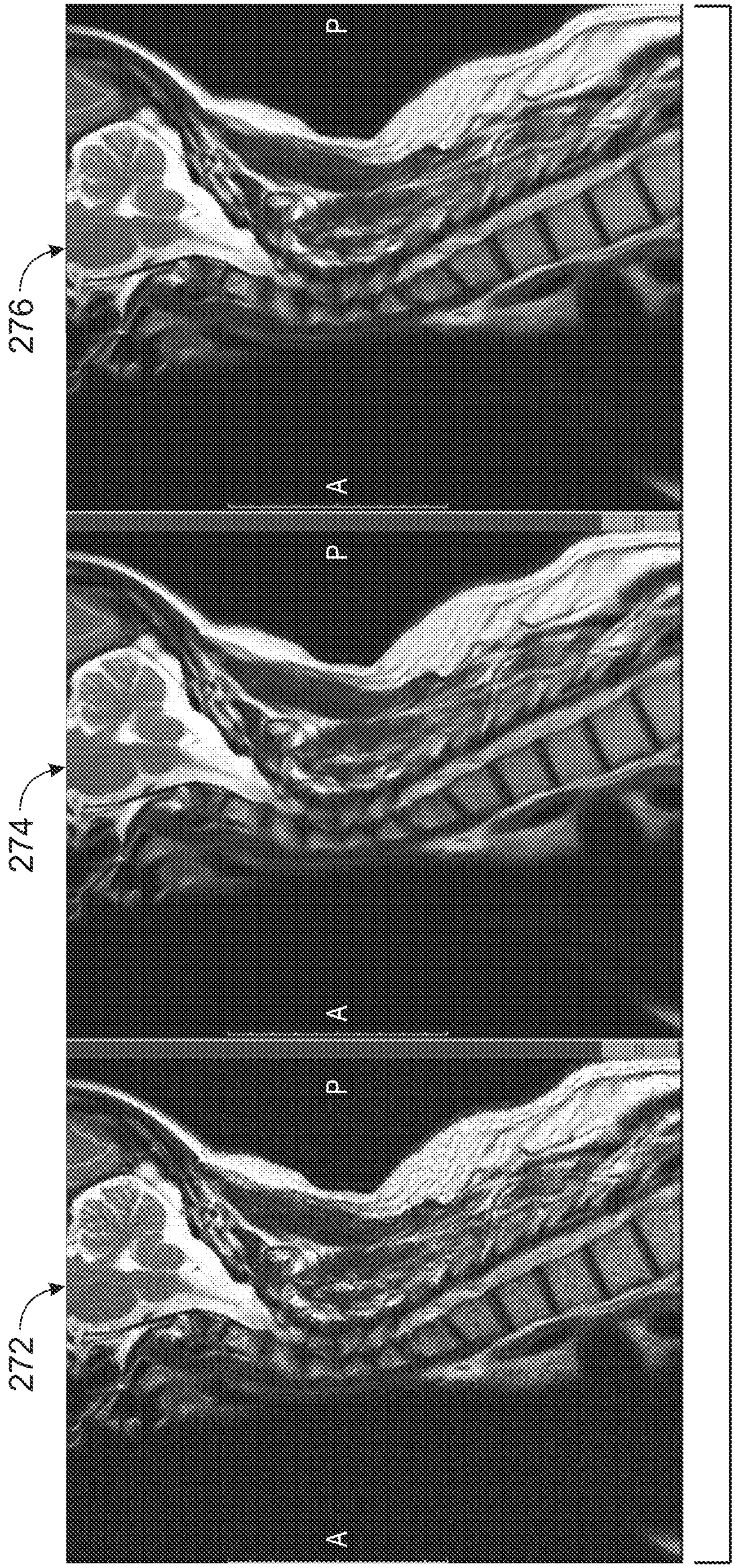
FIG. 12 depicts periodically rotated overlapping parallel lines with enhanced reconstruction (PROPELLER) images of a spine with (with and without residue added back before gridding) and without blade level denoising, in accordance with aspects of the present disclosure.

FIG. 12 depicts PROPELLER images of a spine with (with and without residue added back before gridding) and without blade level denoising. Images 272, 274, and 276 were acquired of a spine (with a C-spine T2 scan) utilizing PROPELLER with a 1.5 Tesla (T) magnetic resonance imaging scanner using a body coil. Image 272 is a PROPELLER image without denoising. Image 274 is the corresponding PROPELLER image with blade level denoising performed (e.g., 100 percent denoising) utilizing the deep learning-based denoising network described above. Image 276 is the corresponding PROPELLER image with blade level nosing performed utilizing the deep learning-based denoising network described above but with 15 percent of the residue added back prior to gridding to add back texture. The quality (e.g., signal-to-noise ratio and sharpness) is improved in images 274 and 276 compared to the image 272.

Figure 13:
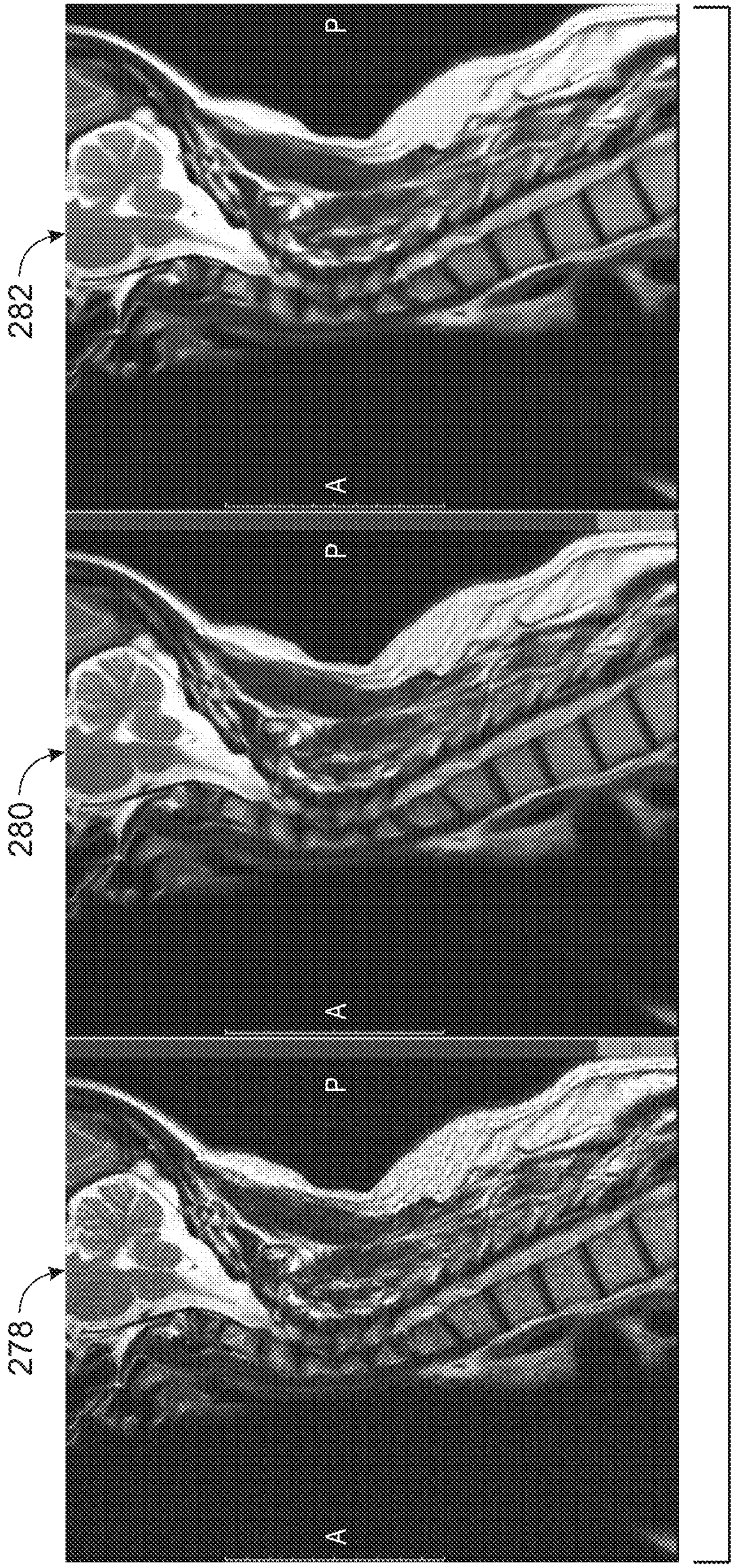
FIG. 13 depicts periodically rotated overlapping parallel lines with enhanced reconstruction (PROPELLER) images of a spine with and without blade level denoising (e.g., with denoising applied to the blades and denoising applied after gridding of the blades), in accordance with aspects of the present disclosure.

FIG. 13 depicts PROPELLER images of a spine with and without blade level denoising (e.g., with denoising applied to the blades and denoising applied after gridding of the blades). Images 278, 280, and 282 were acquired (with a C-spine T2 scan) utilizing PROPELLER with a 1.5 Tesla (T) magnetic resonance imaging scanner using a body coil. Image 278 is a PROPELLER image without denoising. Image 280 is the corresponding PROPELLER image with blade level denoising performed (e.g., 100 percent denoising) utilizing the deep learning-based denoising network described above. Image 282 is a corresponding PROPELLER image with denoising of the gridded image using a residual dense network trained specifically (e.g., on trained natural images) to denoise the colored noise found after gridding Gaussian noise. The quality is improved in image 280 relative to images 278 and 282. In addition, image 280 is sharper than image 282. Also, minor structures blurred out in the image 282 are retained in the image 280. In other words, excessive blurring was observed in image 282 compared to the image 280.

Figure 14:
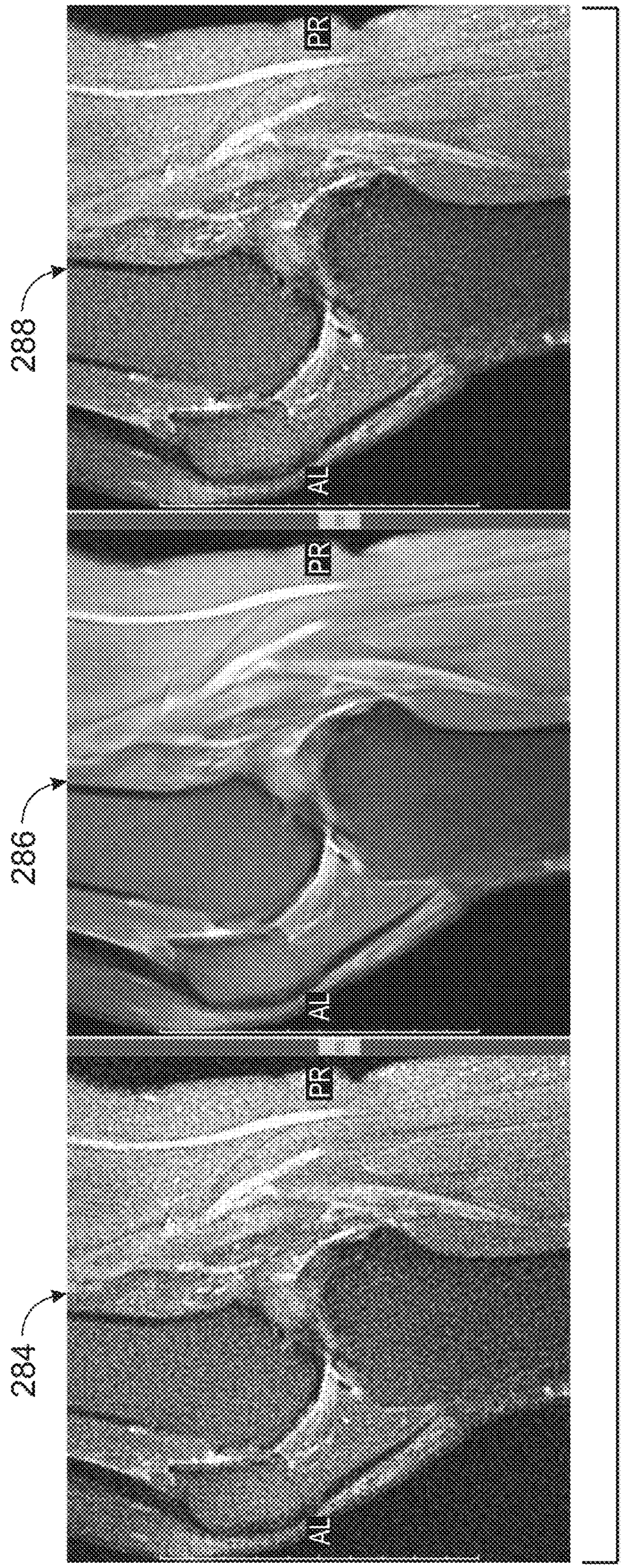
FIG. 14 depicts periodically rotated overlapping parallel lines with enhanced reconstruction (PROPELLER) images of a knee with and without blade level denoising (e.g., utilizing different types of denoising), in accordance with aspects of the present disclosure.

FIG. 14 depicts PROPELLER images of a knee with and without blade level denoising (e.g., utilizing different types of denoising). Images 284, 286, and 288 were acquired (with a proton density-weighted fat-suppressed scan) utilizing PROPELLER with a 1.5 Tesla (T) magnetic resonance imaging scanner using a body coil. Image 284 is a PROPELLER image without denoising. Image 286 is the corresponding PROPELLER image with blade level denoising performed (e.g., 85 percent denoising) utilizing the deep learning-based denoising network described above. Image 288 is a corresponding PROPELLER image obtained utilizing Air™ Recon DL (ARDL) PROPELLER which performs denoising, de-streaking, and super-resolving. The denoising in the image 288 compared to the image 286 is patchy and incomplete.

Technical effects of the disclosed subject matter include providing system and methods for improving image quality of periodically rotated overlapping parallel lines with enhanced reconstruction (PROPELLER) imaging. In particular, the present disclosure provides for denoising individual blades of k-space data prior to phase correcting and gridding the blades of k-space data (where the noise is still Gaussian). Technical effects of the disclosed subject matter include improve image quality in with regard to both signal-to-noise ratio and sharpness.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

This written description uses examples to disclose the present subject matter, including the best mode, and also to enable any person skilled in the art to practice the subject matter, including making and using any devices or systems and performing any incorporated methods. The patentable scope of the subject matter is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A computer-implemented method for improving image quality of periodically rotated overlapping parallel lines with enhanced reconstruction (PROPELLER) imaging, comprising:

acquiring, via a processor, a plurality of blades of k-space data of a region of interest in a rotational manner around a center of k-space via a magnetic resonance imaging (MRI) scanner from a coil during a PROPELLER sequence, wherein each blade of the plurality of blades of k-space data comprises a plurality of parallel phase encoding lines sampled in a phase encoding order;

utilizing, via the processor, a deep learning-based denoising network to individually denoise each blade of the plurality of blades of k-space data to generate a plurality of denoised blades of k-space data, wherein the denoising occurs in a k-space domain; and utilizing, via the processor, a PROPELLER reconstruction algorithm to generate a complex image from the plurality of denoised blades of k-space data.

2. The computer-implemented method of claim 1, wherein the plurality of blades of k-space data is acquired from a single channel of the coil.

3. The computer-implemented method of claim 1, wherein the plurality of blades of k-space data is acquired from a plurality of channels of the coil.

4. The computer-implemented method of claim 3, further comprising combining, via the processor, corresponding blades of k-space data acquired from the plurality of channels to generate the plurality of blades of k-space data prior to utilizing the deep learning-based denoising network to individually denoise each blade of the plurality of blades of k-space data.

5. The computer-implemented method of claim 1, further comprising utilizing, via the processor, a deep learning-based de-streaking network on the complex image to remove streaks.

6. The computer-implemented method of claim 1, further comprising training, via the processor, the deep learning-based denoising network on input-output data pairs utilizing supervised learning, wherein the input-output data pairs comprise near perfect and conventional MR images simulated from natural images, and wherein the deep learning-based denoising network is trained to predict noise in Cartesian acquired images.

7. The computer-implemented method of claim 6, wherein at least some pairs of simulated images comprise skewed aspect ratios.

8. A system for improving image quality of periodically rotated overlapping parallel lines with enhanced reconstruction (PROPELLER) imaging, comprising:

a memory encoding processor-executable routines; and a processor configured to access the memory and to execute the processor-executable routines, wherein the routines, when executed by the processor, cause the processor to:

acquire a plurality of blades of k-space data of a region of interest in a rotational manner around a center of k-space via a magnetic resonance imaging (MRI) scanner from a coil during a PROPELLER sequence, wherein each blade of the plurality of blades of k-space data comprises a plurality of parallel phase encoding lines sampled in a phase encoding order;

utilize a deep learning-based denoising network to individually denoise each blade of the plurality of blades of k-space data to generate a plurality of denoised blades of k-space data, wherein the denoising occurs in a k-space domain; and utilize a PROPELLER reconstruction algorithm to generate a complex image from the plurality of denoised blades of k-space data.

9. The system of claim 8, wherein the plurality of blades of k-space data is acquired from a single channel of the coil.

10. The system of claim 8, wherein the plurality of blades of k-space data is acquired from a plurality of channels of the coil.

11. The system of claim 10, wherein the routines, when executed by the processor, further cause the processor to combine corresponding blades of k-space data acquired from the plurality of channels to generate the plurality of blades of k-space data prior to utilizing the deep learning-based denoising network to individually denoise each blade of the plurality of blades of k-space data.

12. The system of claim 8, further comprising wherein the routines, when executed by the processor, further cause the processor to utilize a deep learning-based de-streaking network on the complex image to remove streaks.

13. The system of claim 8, wherein the routines, when executed by the processor, further cause the processor to train the deep learning-based denoising network on input-output data pairs utilizing supervised learning, wherein the input-output data pairs comprise near perfect and conventional MR images simulated from natural images, and wherein the deep learning-based denoising network is trained to predict noise in Cartesian acquired images.

14. The system of claim 13, wherein at least some pairs of simulated images comprise skewed aspect ratios.

15. A non-transitory computer-readable medium, the computer-readable medium comprising processor-executable code that when executed by a processor, causes the processor to:

acquire a plurality of blades of k-space data of a region of interest in a rotational manner around a center of k-space via a magnetic resonance imaging (MRI) scanner from a coil during a periodically rotated overlapping parallel lines with enhanced reconstruction (PROPELLER) sequence, wherein each blade of the plurality of blades of k-space data comprises a plurality of parallel phase encoding lines sampled in a phase encoding order;

utilize a deep learning-based denoising network to individually denoise each blade of the plurality of blades of k-space data to generate a plurality of denoised blades of k-space data, wherein the denoising occurs in a k-space domain; and utilize a PROPELLER reconstruction algorithm to generate a complex image from the plurality of denoised blades of k-space data.

16. The computer-readable medium of claim 15, wherein the plurality of blades of k-space data is acquired from a single channel of the coil.

17. The computer-readable medium of claim 15, wherein the plurality of blades of k-space data is acquired from a plurality of channels of the coil and wherein the processor-executable code, when executed by the processor, further causes the processor to combine corresponding blades of k-space data acquired from the plurality of channels to generate the plurality of blades of k-space data prior to utilizing the deep learning-based denoising network to individually denoise each blade of the plurality of blades of k-space data.

18. The computer-readable medium of claim 15, wherein the processor-executable code, when executed by the processor, further causes the processor to utilize a deep learning-based de-streaking network on the complex image to remove streaks.

19. The computer-readable medium of claim 15, wherein the processor-executable code, when executed by the processor, further causes the processor to train the deep learning-based denoising network on input-output data pairs utilizing supervised learning, wherein the input-output data pairs near perfect and conventional MR images simulated from natural images, and wherein the deep learning-based denoising network is trained to predict noise in Cartesian acquired images.

20. The computer-readable medium of claim 19, wherein at least some pairs of simulated images comprise skewed aspect ratios.

* * * * *